United States Patent
Preisler et al.

(10) Patent No.: US 10,290,630 B2
(45) Date of Patent: May 14, 2019

(54) BICMOS INTEGRATION WITH REDUCED MASKING STEPS

(71) Applicant: Newport Fab, LLC, Newport Beach, CA (US)

(72) Inventors: Edward Preisler, San Clemente, CA (US); Todd Thibeault, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/660,084

(22) Filed: Mar. 17, 2015

(65) Prior Publication Data

US 2015/0303188 A1 Oct. 22, 2015

Related U.S. Application Data

(60) Provisional application No. 61/980,369, filed on Apr. 16, 2014.

(51) Int. Cl.
*H01L 27/06* (2006.01)
*H01L 21/82* (2006.01)
*H01L 21/8249* (2006.01)

(52) U.S. Cl.
CPC ...... *H01L 27/0623* (2013.01); *H01L 21/8249* (2013.01)

(58) Field of Classification Search
CPC ............... Y02E 10/50; H01L 27/1214; H01L 29/66757; H01L 29/78675; H01L 27/12; H01L 27/0623; H01L 21/8249

USPC .............................................. 257/51; 438/482
See application file for complete search history.

(56) References Cited

U.S. PATENT DOCUMENTS

| | | | | |
|---|---|---|---|---|
| 5,208,171 A | * | 5/1993 | Ohmi | H01L 21/74 257/E21.375 |
| 5,342,794 A | | 8/1994 | Wei | |
| 5,930,635 A | * | 7/1999 | Bashir | H01L 21/8228 257/E21.611 |
| 5,943,564 A | * | 8/1999 | Chen | H01L 21/8249 257/E21.696 |
| 6,830,967 B1 | | 12/2004 | Yin | |
| 6,933,202 B1 | * | 8/2005 | Hurwitz | H01L 21/8228 257/588 |
| 7,145,407 B2 | | 12/2006 | Jeon | |
| 7,335,547 B1 | * | 2/2008 | U'Ren | H01L 21/8249 257/E21.696 |
| 2005/0054170 A1 | | 3/2005 | Steinmann | |
| 2005/0062553 A1 | * | 3/2005 | Jeon | H03K 3/354 331/167 |
| 2007/0013031 A1 | * | 1/2007 | Gray | H01L 21/82285 257/555 |
| 2007/0134854 A1 | | 6/2007 | Zhang | |
| 2008/0227262 A1 | | 9/2008 | El-Kareh | |
| 2008/0316659 A1 | | 12/2008 | Oguzman | |

(Continued)

*Primary Examiner* — Didarul A Mazumder
(74) *Attorney, Agent, or Firm* — Farjami & Farjami LLP (57) ABSTRACT

A bipolar complementary-metal-oxide-semiconductor (BiCMOS) device is disclosed. The BiCMOS device includes a CMOS device in a CMOS region, a PNP bipolar device in a bipolar region, and an NPN bipolar device in the bipolar region. The NPN bipolar device has an extrinsic base being self-aligned with an emitter of the NPN bipolar device. The extrinsic base of the NPN bipolar device and an emitter of the PNP bipolar device share a P type dopant.

10 Claims, 10 Drawing Sheets

(56) References Cited

U.S. PATENT DOCUMENTS

| | | | |
|---|---|---|---|
| 2010/0019326 A1* | 1/2010 | Knoll | H01L 21/82285 257/370 |
| 2010/0032766 A1* | 2/2010 | Chen | H01L 29/404 257/370 |
| 2012/0018811 A1* | 1/2012 | Yeh | H01L 21/8228 257/378 |
| 2014/0291681 A1* | 10/2014 | Kovacic | H01L 29/7325 257/51 |

* cited by examiner

BICMOS INTEGRATION WITH REDUCED MASKING STEPS

The present application claims the benefit of and priority to a provisional patent application entitled "BiCMOS Integration Scheme With Reduced Masking Steps", Ser. No. 61/980,369 filed on Apr. 16, 2014. The disclosure in that provisional application is hereby incorporated fully by reference into the present application.

BACKGROUND

In complementary bipolar complementary-metal-oxide semiconductor (BiCMOS) fabrication processes, bipolar devices and CMOS devices are integrated on the same semiconductor substrate. BiCMOS fabrication processes are flexible in terms of circuit design but can also be very expensive since high performance bipolar devices, such as NPN and PNP silicon-germanium (SiGe) bipolar transistors, require a high mask count when integrated on the same semiconductor substrate as the CMOS devices.

In one approach of complementary BiCMOS process flow, a complex process requiring a mask count in the range of approximately 40 to 50 masking layers is used to form SiGe heterojunction bipolar transistors for both NPN and PNP devices.

In this approach, the process flow enables high performance devices but at a high cost. While this approach might be reasonable for low volume applications where higher wafer costs do not necessarily determine the economic feasibility of a given product, for high volume applications economic concerns dictate that the wafer cost be minimized as much as possible in order to enable a cost effective and profitable product.

In another approach, a relatively simple process flow is used for co-implantation of an undoped SiGe layer to form the bases of the NPN and PNP devices. Although, in this approach, cost is reduced but device performance is compromised by the lack of independently customized SiGe profiles for the bases of the NPN and PNP devices.

Thus, there is a need in the art for a complementary BiCMOS process for efficiently integrating complementary bipolar devices, such as SiGe NPN and PNP devices, with CMOS devices with reduced masking steps to lower manufacturing cost and simplify processing complexity.

SUMMARY

The present disclosure is directed to bipolar complementary-metal-oxide-semiconductor (BiCMOS) integration with reduced masking steps, substantially as shown in and/or described in connection with at least one of the figures, and as set forth in the claims.

DESCRIPTION OF EXEMPLARY IMPLEMENTATIONS

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
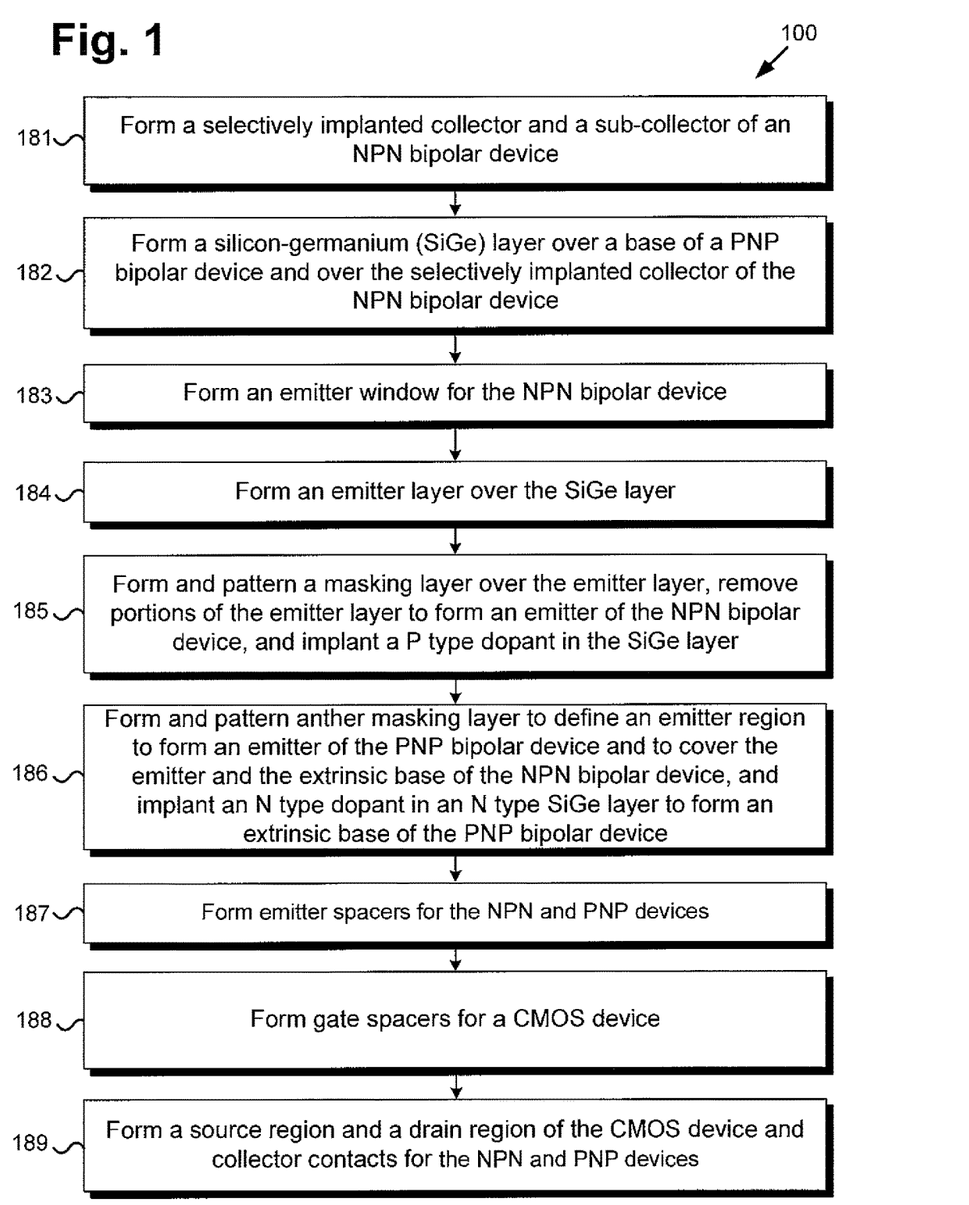
FIG. 1 is a flowchart illustrating a method for fabricating a bipolar complementary-metal-oxide-semiconductor (BiCMOS) device according to one implementation of the present application.

FIG. 1 shows an exemplary diagram illustrating an exemplary method for fabricating a bipolar complementary-metal-oxide-semiconductor (BiCMOS) device having a shared silicon-germanium (SiGe) layer, according to one implementation of the present inventive concepts. Certain details and features have been left out of flowchart 100 that are apparent to a person of ordinary skill in the art. For example, an action may comprise one or more sub actions or may involve specialized equipment or materials, as is known in the art. While actions 181 through 189 indicated in flowchart 100 are sufficient to describe one implementation disclosed herein, other implementations disclosed herein may use actions different from those shown in flowchart 100.

As illustrated in flowchart 100, action 181 includes forming a selectively implanted collector and a sub-collector of an NPN bipolar device. Action 182 includes forming a silicon-germanium (SiGe) layer over a base of a PNP bipolar device and over the selectively implanted collector of the NPN bipolar device. Action 183 includes forming an emitter window for the NPN bipolar device. Action 184 includes forming an emitter layer over the SiGe layer. Action 185 includes forming a masking layer over the emitter layer, patterning the masking layer to define an emitter region in the emitter layer, removing portions of the emitter layer to form an emitter of the NPN bipolar device, and implanting a P type dopant in the SiGe layer to form extrinsic bases of the NPN bipolar device and to dope an emitter of the PNP bipolar device. Action 186 includes forming anther masking layer over the SiGe layer, patterning the another masking layer to define an emitter region of the PNP bipolar device and to cover the emitter and the extrinsic bases of the NPN bipolar device, and implanting an N type dopant in an N type SiGe layer to form extrinsic bases of the PNP bipolar device. Action 187 includes forming emitter spacers for the NPN and PNP devices. Action 188 includes forming gate spacers of a CMOS device. Action 189 includes forming a source region and a drain region of the CMOS device and collector contacts for the NPN and PNP devices.

Figure 2A:
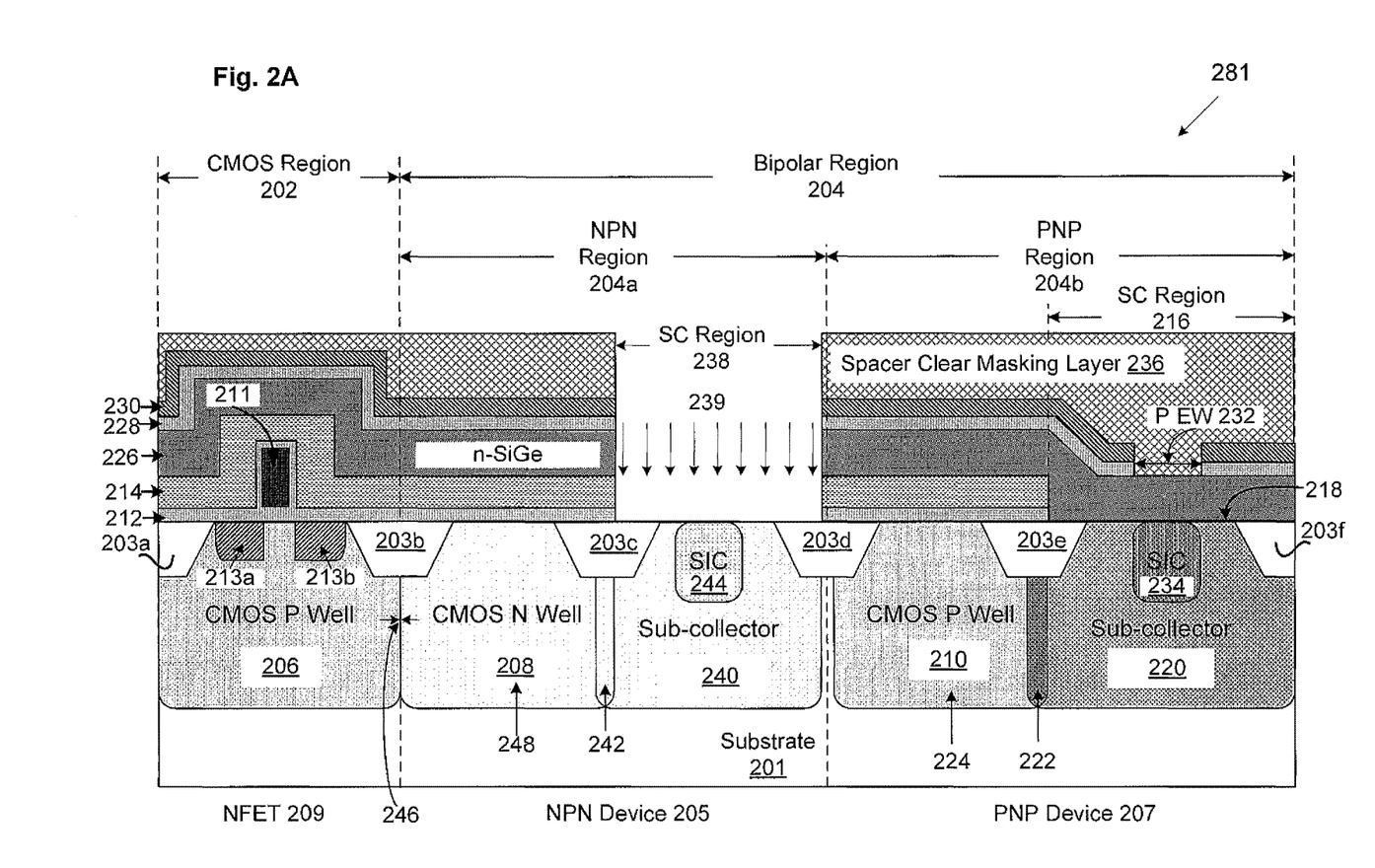
FIG. 2A illustrates a cross-sectional view of a portion of a semiconductor structure processed in accordance with an initial action in the flowchart of FIG. 1 according to one implementation of the present application.
Figure 2B:
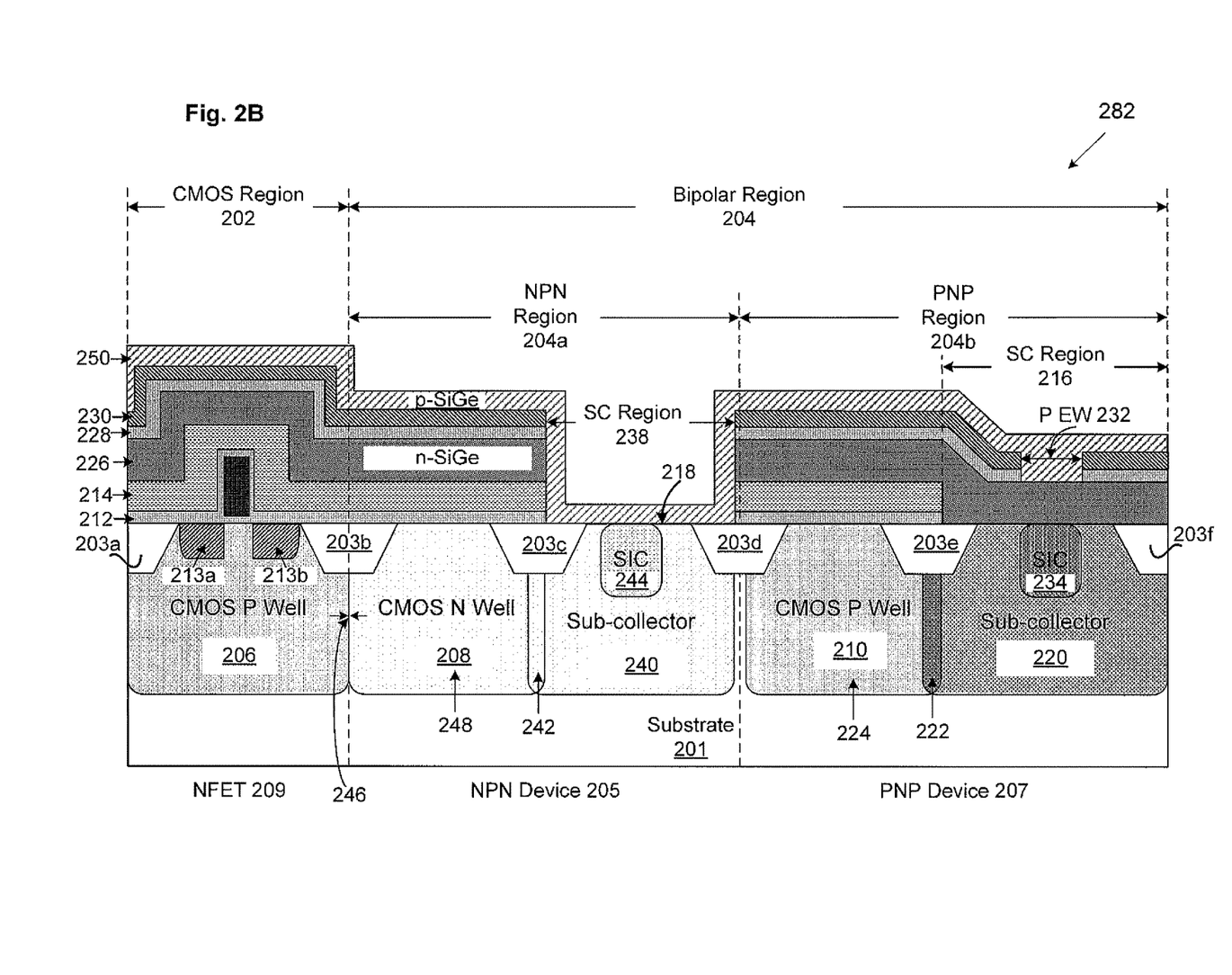
FIG. 2B illustrates a cross-sectional view of a portion of a semiconductor structure processed in accordance with an intermediate action in the flowchart of FIG. 1 according to one implementation of the present application.
Figure 2C:
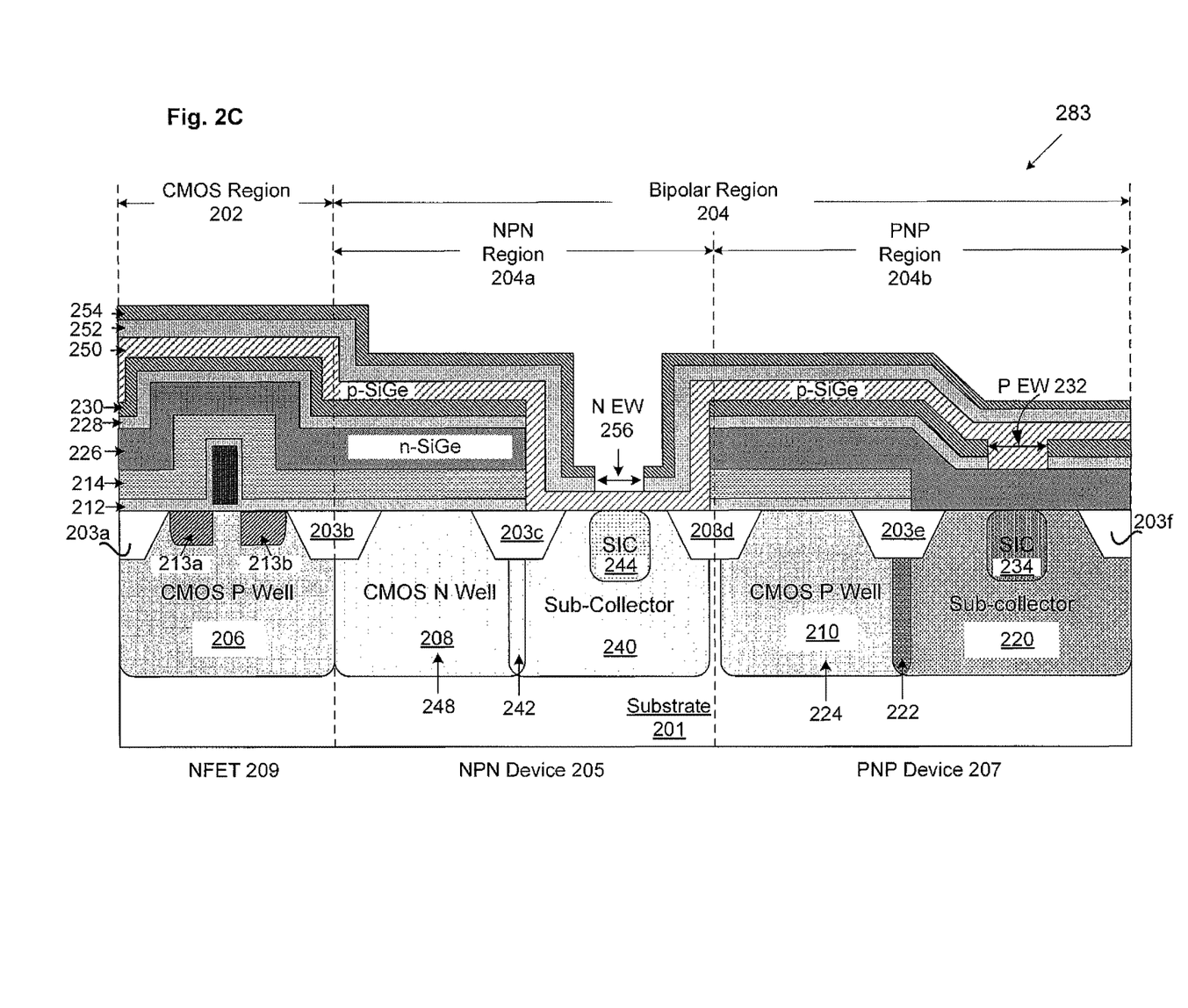
FIG. 2C illustrates a cross-sectional view of a portion of a semiconductor structure processed in accordance with an intermediate action in the flowchart of FIG. 1 according to one implementation of the present application.
Figure 2D:
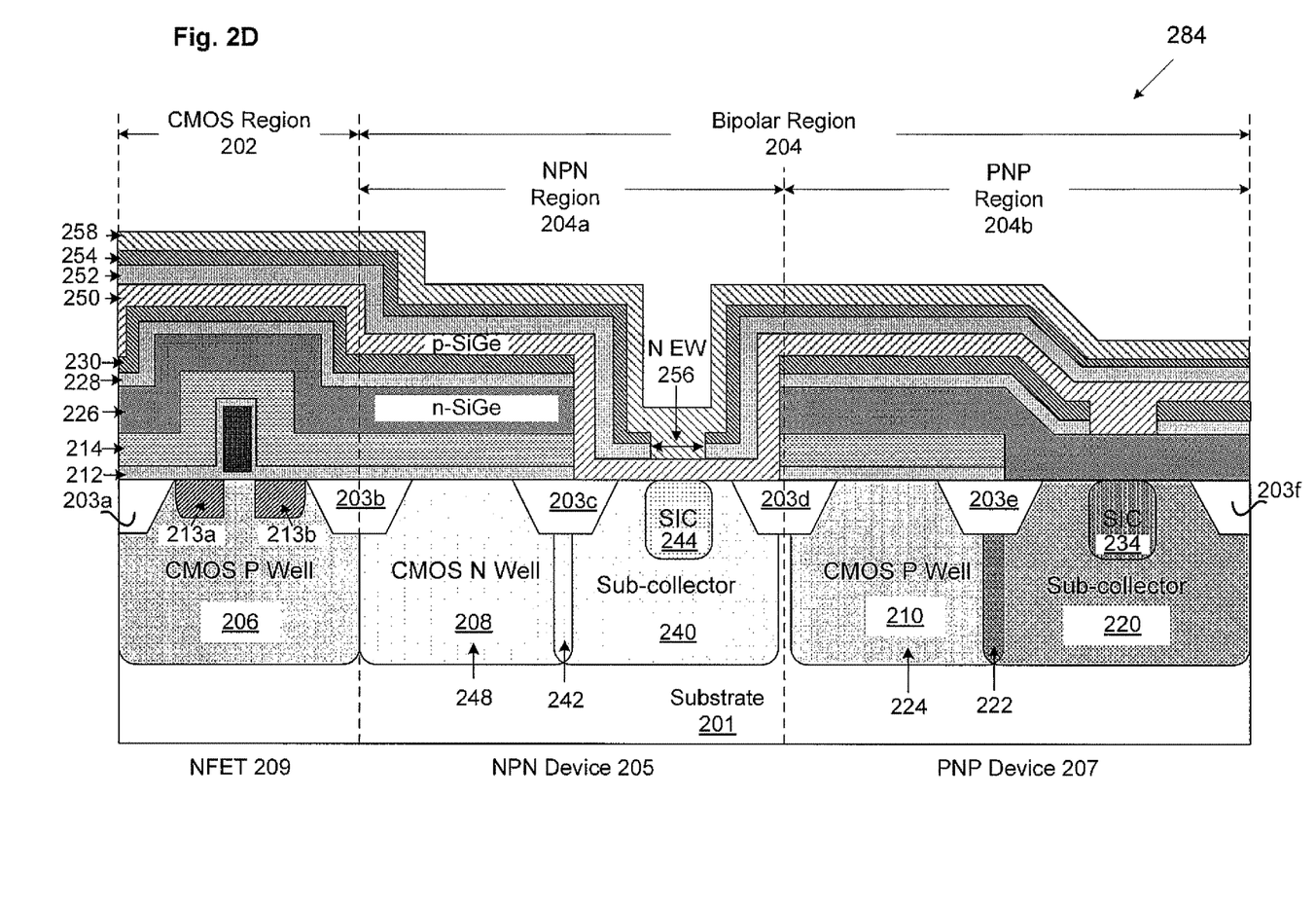
FIG. 2D illustrates a cross-sectional view of a portion of a semiconductor structure processed in accordance with an intermediate action in the flowchart of FIG. 1 according to one implementation of the present application.
Figure 2E:
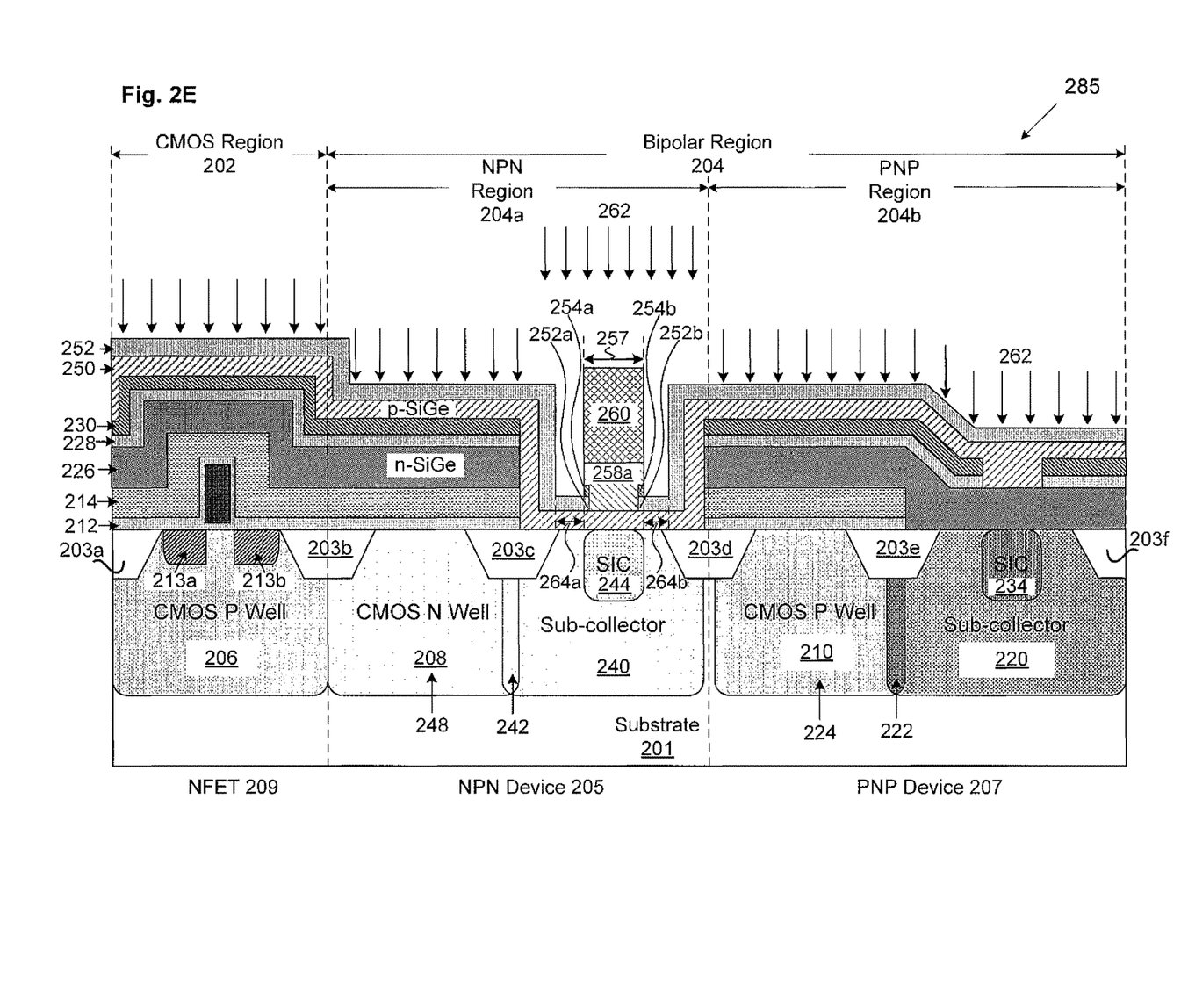
FIG. 2E illustrates a cross-sectional view of a portion of a semiconductor structure processed in accordance with an intermediate action in the flowchart of FIG. 1 according to one implementation of the present application.
Figure 2F:
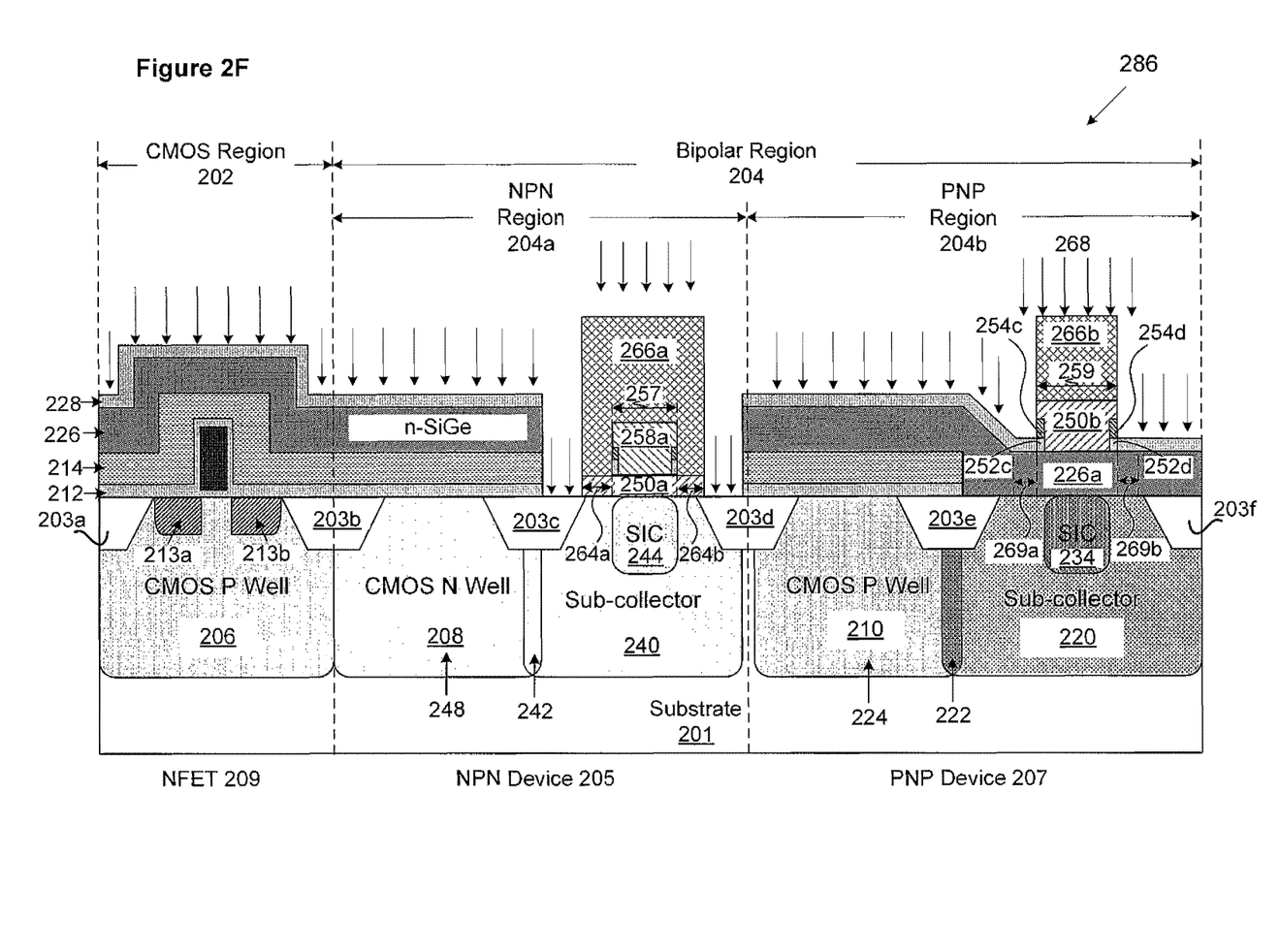
FIG. 2F illustrates a cross-sectional view of a portion of a semiconductor structure processed in accordance with an intermediate action in the flowchart of FIG. 1 according to one implementation of the present application.
Figure 2G:
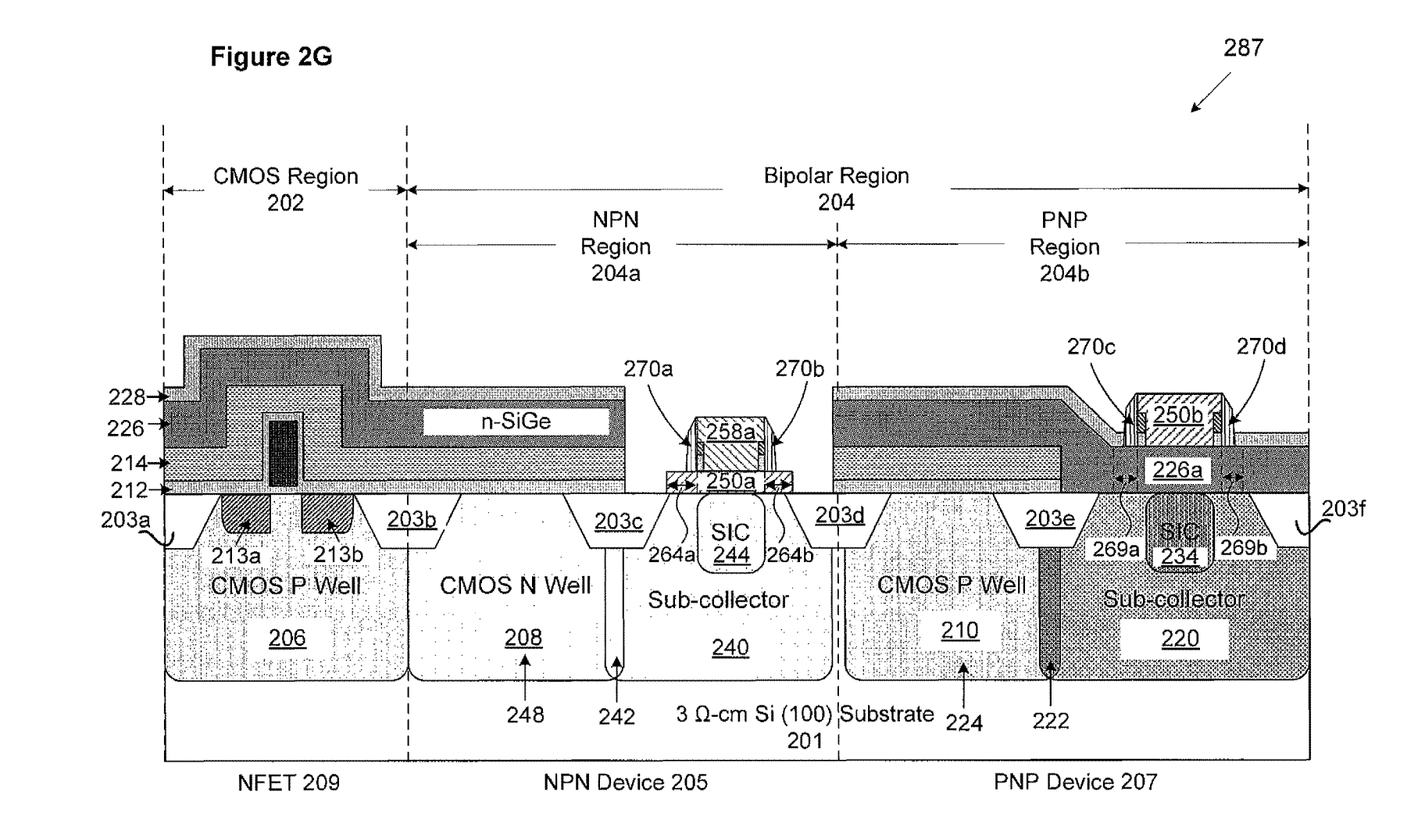
FIG. 2G illustrates a cross-sectional view of a portion of a semiconductor structure processed in accordance with an intermediate action in the flowchart of FIG. 1 according to one implementation of the present application.
Figure 2H:
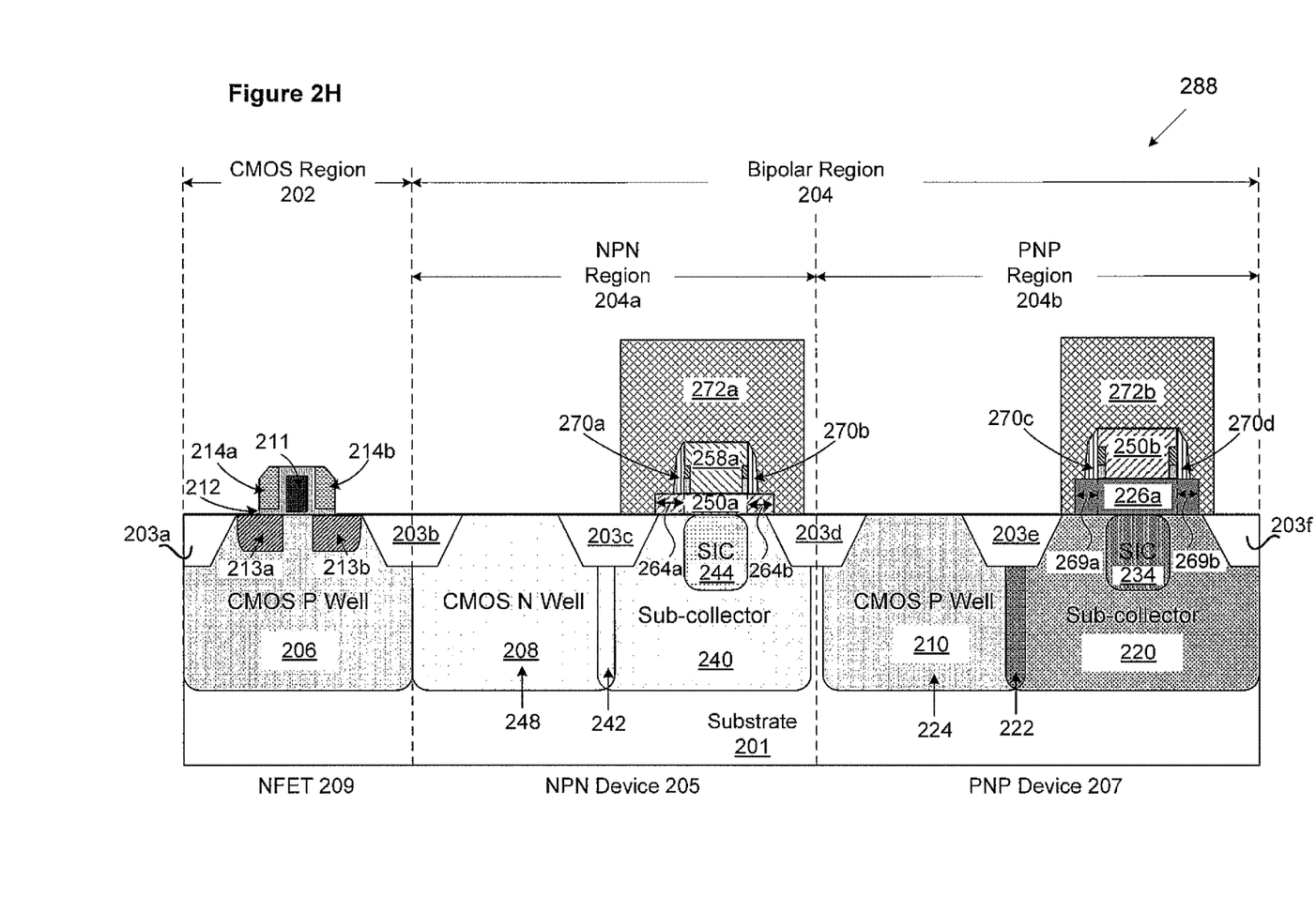
FIG. 2H illustrates a cross-sectional view of a portion of a semiconductor structure processed in accordance with an intermediate action in the flowchart of FIG. 1 according to one implementation of the present application.
Figure 2I:
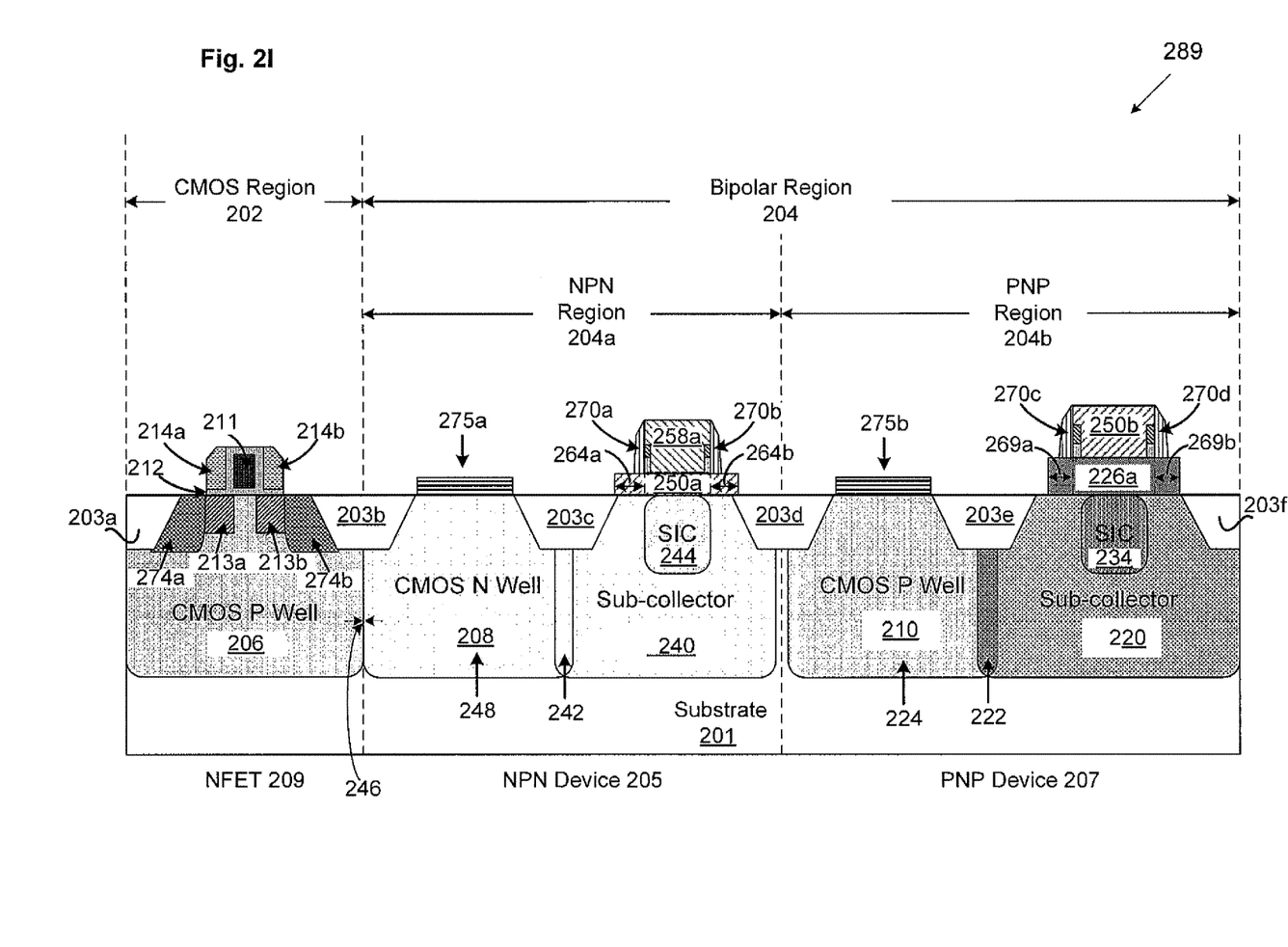
FIG. 2I illustrates a cross-sectional view of a portion of a semiconductor structure processed in accordance with a final action in the flowchart of FIG. 1 according to one implementation of the present application.

FIGS. 2A through 2I and structures 281 through 289 illustrate the result of performing actions 181 through 189 of flowchart 100 of FIG. 1, respectively, according to one implementation of the present disclosure. For example, structure 281 shows a semiconductor structure after action 181, structure 282 shows structure 281 after action 182, structure 283 shows structure 282 after action 183, and so forth. FIG. 2I illustrates a cross-sectional view of a portion of a semiconductor structure processed in accordance with final action 189 in flowchart 100 of FIG. 1, according to one implementation of the present disclosure.

Referring to FIG. 2A, structure 281 illustrates a cross-sectional view of a portion of a semiconductor device after completion of action 181 in flowchart 100 of FIG. 1, according to one implementation of the present disclosure. As shown in FIG. 2A, structure 281 includes semiconductor substrate 201, CMOS P well 206, CMOS N well 208, CMOS P well 210, and isolation regions 203a, 203b, 203c, 203d, 203e and 203f, gate electrode 211, lightly doped source region 213a, lightly doped drain region 213b, common spacer oxide layer 212, common spacer nitride layer 214, sub-collector 220, selectively implanted collector (SIC) 234, N type SiGe layer 226, PNP base oxide layer 228, undoped furnace poly layer 230, PNP emitter window 232, spacer clear masking layer 236, sub-collector 240, and selectively implanted collector (SIC) 244. Specifically, in action 181 of flowchart 100, sub-collector 240 and SIC 244 of NPN device 205 are formed in spacer clear region 238.

Prior to action 181 of flowchart 100, as illustrated in FIG. 2A, CMOS P well 206, CMOS N well 208, CMOS P well 210, and isolation regions 203a, 203b, 203c, 203d, 203e and 203f are formed in semiconductor substrate 201. Also, gate electrode 211 lightly doped source region 213a and lightly doped drain region 213b of N-channel field-effect transistor (NFET) 209 are formed in CMOS region 202, and common spacer oxide layer 212 and common spacer nitride layer 214 are successively formed on semiconductor substrate 201 in CMOS region 202 and bipolar region 204. Also, sub-collector 220 and SIC 234 are formed in spacer clear region 216. PNP emitter window 232 is formed in PNP base oxide layer 228 and undoped furnace poly layer 230.

In the present implementation, semiconductor substrate 201 may include a lightly doped P type silicon or other appropriate substrate material. Isolation regions 203a, 203b, 203c, 203d, 203e and 203f are situated in semiconductor substrate 201, and may include shallow trench isolation (STI) regions having field oxide, such as silicon oxide. CMOS P well 206, CMOS N well 208 and CMOS P well 210 are formed in semiconductor substrate 201 in CMOS region 202, NPN region 204a and PNP region 204b, respectively. In the present implementation, CMOS P wells 206 and 210 may include a heavily doped P type implant. CMOS P well 206 can be utilized as a well region for NFET 209. CMOS P well 210 can be utilized as collector sinker 224 for PNP device 207 in PNP region 204b. In the present implementation, CMOS N well 208 may include a heavily doped N type implant. CMOS N well 208 can be utilized as collector sinker 248 for NPN device 205 in NPN region 204a. As illustrated in FIG. 2A, CMOS P well 206 and CMOS N well 208 form p-n junction 246 to provide electrical isolation between NFET 209 and NPN device 205.

As illustrated in FIG. 2A, gate electrode 211 of NFET 209 is formed over CMOS P well 206. An oxide layer may be formed between gate electrode 211 and CMOS P well 206. Lightly doped source region 213a and lightly doped drain region 213b may be formed in CMOS P well 206 adjacent to gate electrode 211. For example, lightly doped source region 213a and lightly doped drain region 213b may include lightly doped N type dopant. Common spacer oxide layer 212 and common spacer nitride layer 214 are successively formed over semiconductor substrate 201 in CMOS region 202 and bipolar region 204. Common spacer oxide layer 212 can include tetraethylorthosilicate ("TEOS") oxide. Common spacer nitride layer 214 can include silicon nitride. Common spacer oxide layer 212 and/or common spacer nitride layer 214 can be formed over CMOS region 202 and bipolar region 204 of semiconductor substrate 201 by using a chemical vapor deposition ("CVD") process or other appropriate processes. As shown in FIG. 2A, in CMOS region 202, common spacer oxide layer 212 and common spacer nitride layer 214 cover gate electrode 211 of NFET 209. Portions of common spacer nitride layer 214 and common spacer oxide layer 212 are removed to form spacer clear region 216, where sub-collector 220 and SIC 234 of PNP device 207 are formed therein. In the present implementation, high energy boron dopant or other appropriate P type high energy dopant is implanted in semiconductor substrate 201 in spacer clear region 216 to form sub-collector 220 of PNP device 207. SIC 234 having a highly p-doped local collector implant, which is closer to an interface between the sub-collector and the base of PNP device 207, is also formed in spacer clear region 216.

N type SiGe layer 226 is formed in spacer clear region 216 and on common spacer nitride layer 214 over other regions of semiconductor substrate 201. In the present implementation, N type SiGe layer 226 may be epitaxially grown over the exposed top surface 218 of semiconductor substrate 201 in spacer clear region 216. In another implementation, N type SiGe layer 226 may have a graded structure. For example, grading the concentration of germanium in a silicon-germanium base builds into a bipolar device an electric field, which accelerates the carriers across the base, thereby increasing the speed of the heterojunction bipolar device compared to a silicon-only device. For example, a reduced pressure chemical vapor deposition technique, or RPCVD, may be used to fabricate a controlled grading of germanium concentration across the base layer. In another implementation, an undoped SiGe layer can be deposited over in spacer clear region 216 and on common spacer nitride layer 214 over other regions of semiconductor substrate 201, then an N type dopant can be implanted to form N type SiGe layer 226.

As illustrated in FIG. 2A, PNP base oxide layer 228 and undoped furnace poly layer 230 are formed over N type SiGe layer 226. PNP emitter window 232 is formed in undoped furnace poly layer 230 and PNP base oxide layer 228, and aligned with SIC 234 below. In one implementation, PNP emitter window 232 can be formed by depositing a mask over undoped furnace poly layer 230 to define an emitter window opening above SIC 234, and removing portions of undoped furnace poly layer 230 and PNP base oxide layer 228 not covered by the mask using an appropriate etching process to extend the emitter window opening to a top surface N type SiGe layer 226. In another implementation, PNP emitter window 232 may extend to a top surface of PNP base oxide layer 228. In one implementation, an optional organic antireflection coating layer (not shown in FIG. 2A) may be formed over undoped furnace poly layer 230 before the formation of PNP emitter window 232. The organic antireflection coating layer may enhance photolithographic control over the formation of PNP emitter window 232, and may be removed before any further processing action.

As further illustrated in FIG. 2A, structure 281 includes sub-collector 240 and SIC 244 in spacer clear region 238. As illustrated in FIG. 2A, spacer clear masking layer 236 is formed over undoped furnace poly layer 230 to define and form spacer clear region 238 in NPN region 204a for NPN device 205. Spacer clear masking layer 236 may include photoresist or other appropriate masking material. Portions of undoped furnace poly layer 230, PNP base oxide layer 228, N type SiGe layer 226, common spacer nitride layer 214 and common spacer oxide layer 212 not covered by spacer clear masking layer 236 are removed by, for example, using an etching process to expose a portion of top surface 218 of semiconductor substrate 201 in spacer clear region 238. High energy spacer clear implant 239, such as high energy phosphorous dopant or other appropriate N type high energy dopant, is implanted in semiconductor substrate 201 in spacer clear region 238, thereby forming sub-collector 240 of NPN device 205. While spacer clear masking layer 236 is still in place, SIC 244 having a highly N-doped local collector implant, which is closer to an interface between the sub-collector and the base of NPN device 205, is also formed.

Referring now to FIG. 2B, structure 282 illustrates a cross-sectional view of a portion of a semiconductor device after completion of action 182 in flowchart 100 of FIG. 1, according to one implementation of the present disclosure. As shown in FIG. 2B, structure 282 includes P type SiGe layer 250 formed over top surface 218 of semiconductor substrate 201 in spacer clear region 238, undoped furnace poly layer 230, and the exposed top surface of N type SiGe layer 226 in PNP emitter window 232, after spacer clear masking layer 236 is removed. As illustrated in FIG. 2B, P type SiGe layer 250 in PNP emitter window 232 is in direct physical and electrical contact with N type SiGe layer 226. P type SiGe layer 250 in spacer clear region 238 is in direct physical and electrical contact with SIC 244.

In the present implementation, P type SiGe layer 250 forms a P type base of NPN device 205 in spacer clear region 238, and a P type emitter of PNP device 207 in spacer clear region 216. P type SiGe layer 250 can be formed by using an appropriate deposition process. For example, P type SiGe layer 250 may be a single crystalline layer grown epitaxially over top surface 218 of semiconductor substrate 201 in spacer clear region 238, and a polycrystalline layer over undoped furnace poly layer 230 and in PNP emitter window 232. Thus, the portion of P type SiGe layer 250 in spacer clear region 238 over SIC 244 can be used to form a single crystalline base for NPN device 205, and the portion of P type SiGe layer 250 in PNP emitter window 232 can be used to form a polycrystalline emitter for PNP device 207.

In one implementation, the SiGe profile of P type SiGe layer 250 in spacer clear region 238 can be individually customized to form the base of NPN device 205, independent of the SiGe profile of N type SiGe layer 226 as the base of PNP device 207 in spacer clear region 216. Also, P type SiGe layer 250 in spacer clear region 238 and in spacer clear region 216 can have different SiGe profiles and crystalline structures. In one implementation, P type SiGe layer 250 may have a graded structure. For example, grading the concentration of germanium in a silicon-germanium base builds into a bipolar device an electric field, which accelerates the carriers across the base, thereby increasing the speed of the heterojunction bipolar device compared to a silicon-only device. For example, a reduced pressure chemical vapor deposition technique, or RPCVD, may be used to fabricate a controlled grading of germanium concentration across the base layer.

Referring now to FIG. 2C, structure 283 illustrates a cross-sectional view of a portion of a semiconductor device after completion of action 183 in flowchart 100 of FIG. 1, according to one implementation of the present disclosure. As shown in FIG. 2C, structure 283 includes NPN base oxide layer 252 and undoped furnace poly layer 254 formed over P type SiGe layer 250. NPN emitter window 256 is formed in undoped furnace poly layer 254 and NPN base oxide layer 252 in NPN region 204a, and aligned with SIC 244. In one implementation, NPN emitter window 256 can be formed by depositing a mask (not shown in FIG. 2C) over undoped furnace poly layer 254 to define an emitter window opening above SIC 244, and removing portions of undoped furnace poly layer 254 and NPN base oxide layer 252 not covered by the mask using an appropriate etch process to extend the emitter window opening to a top surface P type SiGe layer 250. In another implementation, NPN emitter window 256 may extend to a top surface of NPN base oxide layer 252. In one implementation, an optional organic antireflection coating layer (not shown in FIG. 2C) may be formed over undoped furnace poly layer 254 before the formation of NPN emitter window 256. The organic antireflection coating layer may enhance photolithographic control over the formation of NPN emitter window 256, and may be removed before any further processing action.

Referring now to FIG. 2D, structure 284 illustrates a cross-sectional view of a portion of a semiconductor device after completion of action 184 in flowchart 100 of FIG. 1, according to one implementation of the present disclosure. As shown in FIG. 2D, structure 284 includes N type emitter poly layer 258 formed on undoped furnace poly layer 254 and the exposed top surface of P type SiGe layer 250 in NPN emitter window 256 over semiconductor substrate 201. In the present implementation, N type emitter poly layer 258 is a polysilicon layer, which may be formed by in-situ N type doping an epitaxial layer or growing undoped poly layer then implanting an N type dopant, such as phosphorus, arsenic or antimony. N type emitter poly layer 258 is utilized to form an emitter of NPN device 205 in a subsequent action.

Referring now to FIG. 2E, structure 285 illustrates a cross-sectional view of a portion of a semiconductor device after completion of action 185 in flowchart 100 of FIG. 1, according to one implementation of the present disclosure. As shown in FIG. 2E, structure 285 includes N type emitter 258a, masking layer 260, and extrinsic bases 264a and 264b of NPN device 205 having P type dopant 262.

As illustrated in FIG. 2E, masking layer 260 is disposed over N type emitter poly layer 258, and patterned to define emitter region 257 in N type emitter poly layer 258 for forming N type emitter 258a. Masking layer 260 may include photoresist or other appropriate masking material. While N type emitter poly layer 258 in emitter region 257 is protected by patterned masking layer 260, the unprotected portions of N type emitter poly layer 258 and undoped furnace poly layer 254 are removed from structure 285. As a result, N type emitter 258a of NPN device 205 is formed. Portions 254a and 254b of undoped furnace poly layer 254 tucked under N type emitter 258a of N type emitter poly layer 258 below masking layer 260 may remain after the removal process. Portions of NPN base oxide layer 252 may also be removed from structure 285 subsequently. Portions 252a and 252b of NPN base oxide layer 252 tucked under N type emitter poly layer 258 below masking layer 260 may remain after the removal process.

As can be seen in FIG. 2E, P type dopant 262 is implanted over structure 285, while masking layer 260 covers and protects N type emitter 258a. Specifically, P type dopant 262 is implanted in P type SiGe layer 250 to form extrinsic bases 264a and 264b in NPN region 204a. As a result of using masking layer 260 to pattern and protect N type emitter 258a, extrinsic bases 264a and 264b are self-aligned with N type emitter 258a. Also, P type dopant 262 is implanted in P type SiGe layer 250 over PNP region 204b as a PNP emitter implant.

Thus, masking layer 260 is utilized to define emitter region 257 in N type emitter poly layer 258 for forming N type emitter 258a of NPN device 205, and to protect N type emitter 258a during the implantation of P type dopant 262, which is used to form extrinsic bases 264a and 264b self-aligned with N type emitter 258a of NPN device 205. Also, the use of masking layer 260 allows extrinsic bases 264a and 264b of NPN device 205 and the emitter of PNP device 207 to share P type dopant 262, such that both extrinsic bases 264a and 264b of NPN device 205 and the emitter of PNP device 207 are implanted at the same time in a single implanting action. The multi-use of masking layer 260 saves manufacture cost and time.

Referring now to FIG. 2F, structure 286 illustrates a cross-sectional view of a portion of a semiconductor device after completion of action 186 in flowchart 100 of FIG. 1, according to one implementation of the present disclosure. As shown in FIG. 2F, structure 286 includes N type emitter 258a, P type SiGe base 250a, and extrinsic bases 264a and 264b of NPN device 205 in NPN region 204a, and P type SiGe emitter 250b, N type SiGe base 226a, and extrinsic bases 269a and 269b of PNP device 207 in PNP region 204b.

As illustrated in FIG. 2F, masking layer 266 is formed over structure 286, and patterned to form portions 266a and 266b, where portion 266a of masking layer 266 covers N type emitter 258a, P type SiGe base 250a, and extrinsic bases 264a and 264b of NPN device 205, and portion 266b of masking layer 266 defines emitter region 259 in P type SiGe layer 250 for forming P type SiGe emitter 250b. Portions 266a and 266b of masking layer 266 may include photoresist or other appropriate masking material. While portion 266a of masking layer 266 covers N type emitter 258a and extrinsic bases 264a and 264b of NPN device 205, and portion 266b of masking layer 266 covers emitter region 259 in P type SiGe layer 250, the unprotected portions of P type SiGe layer 250 are removed from structure 286. As a result, P type SiGe emitter 250b of PNP device 207 is formed. Portions 254c and 254d of undoped furnace poly layer 254 tucked under P type SiGe emitter 250b below portion 266b of masking layer 266 may remain after the removal process. Portions of NPN base oxide layer 252 may also be removed from structure 286 subsequently. Portions 252c and 252d of NPN base oxide layer 252 tucked under P type SiGe emitter 250b below portion 266b of masking layer 266b may remain after the removal process.

As illustrated in FIG. 2F, while portions 266a and 266b of masking layer 266 are still in place, N type dopant 268 is implanted over structure 286. Specifically, N type dopant 268 is implanted in N type SiGe layer 226 to form extrinsic bases 269a and 269b of PNP device 207. As a result of using portion 266b of masking layer 266 to define emitter region 259 for forming P type SiGe emitter 250b and to protect P type SiGe emitter 250b during the implantation of N type dopant 268, extrinsic bases 269a and 269b are self-aligned with P type SiGe emitter 250b. Thus, portion 266a of masking layer 266 is used to protect N type emitter 258a and extrinsic bases 264a and 264b of NPN device 205 during the implantation of N type dopant 268. Also, portion 266b of masking layer 266 is used during the formations of P type SiGe emitter 250b, and extrinsic bases 269a and 269b of PNP device 207. Thus, the multi-use of masking layer 266 again saves manufacture cost and time.

Referring now to FIG. 2G, structure 287 illustrates a cross-sectional view of a portion of a semiconductor device after completion of action 187 in flowchart 100 of FIG. 1, according to one implementation of the present disclosure. As shown in FIG. 2G, structure 287 includes NPN emitter spacers 270a and 270b formed on N type emitter 258a of NPN device 205. Structure 287 also includes PNP emitter spacers 270c and 270d formed on P type SiGe emitter 250b of PNP device 207. In the present implementation, NPN emitter spacers 270a and 270b and PNP emitter spacers 270c and 270d are formed simultaneously in a single processing action. For example, NPN emitter spacers 270a and 270b and PNP emitter spacers 270c and 270d may be formed by depositing blanket oxide layer 270 over NPN region 204a and PNP region 204b, then etching blanket oxide layer 270 back to form the spacers. As such, NPN emitter spacers 270a and 270b and PNP emitter spacers 270c and 270d can be formed simultaneously using a common spacer layer.

Referring now to FIG. 2H, structure 288 illustrates a cross-sectional view of a portion of a semiconductor device after completion of action 188 in flowchart 100 of FIG. 1, according to one implementation of the present disclosure. As shown in FIG. 2H, structure 288 includes gate spacers 214a and 214b formed on gate electrode 211 of NFET 209. As illustrated in FIG. 2H, masking layer 272 is formed over semiconductor substrate 201, and patterned to form portions 272a and 272b, where portion 272a of masking layer 272 covers N type emitter 258a, P type SiGe base 250a, and extrinsic bases 264a and 264b of NPN device 205, and portion 272b of masking layer 272 covers P type SiGe emitter 250b, N type SiGe base 226a, and extrinsic bases 269a and 269b of PNP device 207. Masking layer 272 may include photoresist or other appropriate masking material. While portions 272a and 272b of masking layer 272 are in place to cover the respective emitters and bases of NPN device 205 and PNP device 207, an etching is performed to remove the unprotected layers on semiconductor substrate 201, including portions of PNP base oxide layer 228, N type SiGe layer 226, common spacer nitride layer 214 and common spacer oxide layer 212.

As illustrated in FIG. 2H, after the removal of the above-mentioned unprotected layers, gate spacers 214a and 214b of gate electrode 211 are formed on NFET 209 by removing portions of common spacer nitride layer 214, as a result of the etching. Thereafter, gate spacers 214a and 214b formed on gate electrode 211 of NFET 209. In the present implementation, gate spacers 214a and 214b include silicon nitride. In other implementations, gate spacers 214a and 214b can include silicon oxide or other appropriate dielectric material. Gate spacers 214a and 214b can be formed by depositing a conformal common spacer layer, such as a silicon oxide and/or silicon nitride layer, over CMOS region 202 and bipolar region 204 of semiconductor substrate 201. The layer of dielectric material can then be etched back using an anisotropic etching process to form gate spacers 214a and 214b.

Referring now to FIG. 2I, structure 289 illustrates a cross-sectional view of a portion of a semiconductor device after completion of action 189 in flowchart 100 of FIG. 1, according to one implementation of the present disclosure. As shown in FIG. 2I, in structure 289, source region 274a and drain region 274b of NFET 209, collector contact 275a of NPN device 205, and collector contact 275b of PNP device 207 are, among other things, formed after completion of action 189 of flowchart 100.

As illustrated in FIG. 2I, structure 289 includes NFET 209 in CMOS region 202, NPN device 205 in NPN region 204a, and PNP device 207 in PNP region 204b. NFET 209 includes CMOS P well 206, gate electrode 211, common spacer oxide layer 212, gate spacers 214a and 214b, lightly doped source region 213a, lightly doped drain region 213b, source region 274a and drain region 274b. CMOS P well 206 is situated between isolation regions 203a and 203b in CMOS region 202. Gate electrode 211 is situated over CMOS P well 206 on common spacer oxide layer 212 in CMOS region 202. For example, gate electrode 211 includes polycrystalline silicon. Gate spacers 214a and 214b are situated adjacent to gate electrode 211 and over CMOS P well 206 in CMOS region 202. Lightly doped source region 213a and lightly doped drain region 213b are formed adjacent to gate electrode 211 in CMOS P well 206 in CMOS region 202. Lightly doped source region 213a and lightly doped drain region 213b include lightly doped N type regions. Source region 274a and drain region 274b are formed in CMOS region 202 of semiconductor substrate 201. Source region 274a is situated in CMOS P well 206 between isolation region 203a and lightly doped source region 213a. Drain region 274b is situated in CMOS P well 206 between isolation region 203b and lightly doped drain region 213b.

As illustrated in FIG. 2I, NPN device 205 includes N type emitter 258a, NPN emitter spacers 270a and 270b, P type SiGe base 250a, extrinsic bases 264a and 264b SIC 244, N type sub-collector 240, collector sinker 248 and collector contact 275a. In the present implementation, NPN device 205 is a vertical heterojunction bipolar transistor. N type emitter 258a is situated between NPN emitter spacers 270a and 270b and over P type SiGe base 250a in NPN region 204a. N type emitter 258a can include N type polycrystalline silicon, which can be doped with phosphorus or other appropriate N type dopant. Extrinsic bases 264a and 264b can be heavily doped, and situated in P type SiGe base 250a adjacent to N type emitter 258a in semiconductor substrate 201 in NPN region 204a. Sub-collector 240 and SIC 244 of NPN device 205 are formed in NPN region 204a. As illustrated in FIG. 2I, sub-collector 240 and collector sinker 248 may have substantially the same depth below top surface 218 in semiconductor substrate 201. Sub-collector 240 having an N type high energy spacer clear implant partially overlaps collector sinker 248 having heavily doped N type implant in overlapped region 242. Sub-collector 240 and collector sinker 248 form a direct electrical path for external connection using collector contact 275a of NPN device 205.

In the present implementation, CMOS P well 206 for NFET 209 and collector sinker 248 formed using CMOS N well 208 form p-n junction 246 in semiconductor substrate 201, where p-n junction 246 provides electrical isolation between NFET 209 and NPN device 205 in semiconductor substrate 201. As such, CMOS P well 206 for NFET 209 and collector sinker 248 of NPN device 205 need not be placed apart from each other, thereby saving usable space on semiconductor substrate 201.

As illustrated in FIG. 2I, PNP device 207 includes P type SiGe emitter 250b, PNP emitter spacers 270c and 270d, N type SiGe base 226a, extrinsic bases 269a and 269b, SIC 234, P type sub-collector 220, collector sinker 224 and collector contact 275b. In the present implementation, PNP device 207 is a vertical heterojunction bipolar transistor. P type SiGe emitter 250b is situated between PNP emitter spacers 270c and 270d and over N type SiGe base 226a in PNP region 204b. Extrinsic bases 269a and 269b can be heavily doped, and situated in N type SiGe base 226a adjacent to P type SiGe emitter 250b in PNP region 204b. Sub-collector 220 and SIC 234 of PNP device 207 are formed in PNP region 204b. As illustrated in FIG. 2I, sub-collector 220 and collector sinker 224 may have substantially the same depth below top surface 218 in semiconductor substrate 201. Sub-collector 220 having a P type high energy spacer clear implant partially overlaps collector sinker 224 having a heavily doped P type implant in overlapped region 222. Sub-collector 220 and collector sinker 224 form a direct electrical path for external connection using collector contact 275b of PNP device 207.

In the present implementation, collector sinker 224 of PNP device 207 and sub-collector 240 of NPN device 205 are spaced apart from each other to provide electrical isolation between PNP device 207 and NPN device 205. In another implementation, collector sinker 224 of PNP device 207 and sub-collector 240 of NPN device 205 may be placed immediately adjacent to each other.

Although FIGS. 2A-2I illustrate the formations of NFET 209, NPN device 205 and PNP device 207 in the present implementation, it should be understood that, in another implementation according to the present inventive concepts, the above-mentioned regions can be interchanged with the formations of a PFET, a PNP device and an NPN device, by implanting dopants with reversed polarities in each of the corresponding regions.

Thus, the present inventive concepts utilize a masking layer to define an emitter region for forming an emitter of an NPN device, and to protect the emitter during an implanting action, where a dopant is used to form extrinsic bases of the NPN device self-aligned with the emitter of the NPN device. In addition, the use of the masking layer allows the extrinsic base regions of the NPN device and an emitter of a PNP device to share a common implant, such that both the extrinsic base regions of the NPN device and the emitter of the PNP device are formed at the same time in a single implanting action. The advantages of the present inventive concepts may include reduced cost of fabrication due to the multi-use of the masking layer, and the elimination of one or more process steps related to conventional process flow of individually forming the respective bases and emitters of the bipolar devices.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A bipolar complementary-metal-oxide-semiconductor (BiCMOS) device comprising:
   a CMOS device in a CMOS region;
   a PNP bipolar device in a bipolar region;
   an NPN bipolar device in said bipolar region and forming a p-n junction with said CMOS device, said NPN bipolar device having an extrinsic base being self-aligned with an emitter of said NPN bipolar device;
   wherein said extrinsic base of said NPN bipolar device and an emitter of said PNP bipolar device share a P type dopant;
   wherein said NPN bipolar device includes a CMOS N well having a first dopant concentration;
   wherein said NPN bipolar device includes a sub-collector having a second dopant concentration, wherein said CMOS N well is a collector sinker for said NPN bipolar device;
   wherein said first dopant concentration of said CMOS N well is greater than said second dopant concentration of said sub-collector;
   wherein said sub-collector and said CMOS N well are laterally adjacent, have substantially the same depth with a partially overlapped region, and have bottom surfaces directly contacting a substrate, such that said sub-collector and said CMOS N well form a direct electrical path for external connection;
   wherein said sub-collector is a singly doped region between said extrinsic base and said substrate.

2. The BiCMOS device of claim 1, wherein said extrinsic base of said NPN bipolar device comprises silicon germanium (SiGe).

3. The BiCMOS device of claim 1, wherein said PNP bipolar device comprises an extrinsic base being self-aligned with said emitter of said PNP bipolar device.

4. The BiCMOS device of claim 3, wherein said extrinsic base of said PNP bipolar device comprises silicon germanium (SiGe).

5. The BiCMOS device of claim 1, wherein said PNP bipolar device comprises an N type silicon germanium (SiGe) base.

6. The BiCMOS device of claim 1, wherein said NPN bipolar device comprises a P type silicon germanium (SiGe) base.

7. The BiCMOS device of claim 1, wherein said NPN bipolar device comprises a single crystalline base.

8. The BiCMOS device of claim 1, wherein said emitter of said PNP bipolar device is a polycrystalline emitter.

9. The BiCMOS device of claim 1, wherein each of said NPN bipolar device and said PNP bipolar device comprises a sub-collector and a selectively implanted collector.

10. The BiCMOS device of claim 1, wherein said CMOS device is an N-channel field-effect transistor (NFET).

* * * * *